(12) United States Patent
Chang

(10) Patent No.: US 8,610,277 B2
(45) Date of Patent: Dec. 17, 2013

(54) BRIDGE TYPE PAD STRUCTURE OF A SEMICONDUCTOR DEVICE

(75) Inventor: Jin-Man Chang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 446 days.

(21) Appl. No.: 12/180,397

(22) Filed: Jul. 25, 2008

(65) Prior Publication Data

US 2009/0032957 A1    Feb. 5, 2009

(30) Foreign Application Priority Data

Jul. 31, 2007  (KR) .......................... 10-2007-0076824

(51) Int. Cl.
*H01L 23/48* (2006.01)

(52) U.S. Cl.
USPC ........... 257/753; 257/724; 257/738; 257/763; 257/780; 257/786; 257/E23.135; 361/770; 361/771

(58) Field of Classification Search
USPC ................... 257/724, E23.135, 734–787; 361/770–771
See application file for complete search history.

(56) References Cited

U.S. PATENT DOCUMENTS

| | | | | |
|---|---|---|---|---|
| 6,255,586 B1 * | 7/2001 | Kim et al. | ...................... | 174/538 |
| 6,281,046 B1 * | 8/2001 | Lam | .............................. | 438/113 |
| 6,743,661 B1 * | 6/2004 | Drewery | ....................... | 438/110 |
| 7,566,975 B2 * | 7/2009 | Motoyama | ..................... | 257/762 |
| 2002/0011669 A1 * | 1/2002 | Fujiki et al. | .................... | 257/751 |
| 2005/0067707 A1 * | 3/2005 | Hashimoto et al. | ........... | 257/758 |
| 2005/0082680 A1 | 4/2005 | Liu et al. | | |
| 2006/0006536 A1 * | 1/2006 | Lee et al. | ....................... | 257/738 |
| 2006/0207790 A1 | 9/2006 | Choi | | |
| 2006/0246631 A1 * | 11/2006 | Lutz et al. | ..................... | 438/127 |

FOREIGN PATENT DOCUMENTS

| | | | |
|---|---|---|---|
| JP | 2001-24081 | | 1/2001 |
| JP | 2001024081 A | * | 1/2001 |
| JP | 2002-324601 | | 11/2002 |
| JP | 2002324601 A | * | 11/2002 |
| KR | 10-2002-0053947 | | 7/2002 |
| KR | 10-2006-0100275 | | 9/2006 |

OTHER PUBLICATIONS

Office Action issued on Apr. 29, 2013 in corresponding Korean Patent Application No. 10-2007-0076824.

* cited by examiner

*Primary Examiner* — Alexander Sofocleous
*Assistant Examiner* — John P Dulka
(74) *Attorney, Agent, or Firm* — Onello & Mello, LLP

(57) ABSTRACT

A semiconductor device includes a lower structure, an insulation layer, metal contacts, a bridge and a metal pad. The lower structure has a metal wiring. An insulation layer is formed on the lower structure. The metal contacts penetrate the insulation layer to be connected to the metal wiring. The bridge is provided in the insulation layer, the bridge connecting the metal contacts to one another. The metal pad is provided on the insulation layer, the metal pad making contact with the metal contacts.

10 Claims, 5 Drawing Sheets

BRIDGE TYPE PAD STRUCTURE OF A SEMICONDUCTOR DEVICE

PRIORITY STATEMENT

This application claims priority under 35 U.S.C. §119 to Korean Patent Application No. 2007-76824, filed on Jul. 31, 2007, the contents of which are herein incorporated by reference in their entirety.

SUMMARY

Example embodiments of the present invention relate to a semiconductor device and a method of manufacturing the semiconductor device. More particularly, example embodiments of the present invention relate to a semiconductor device capable of preventing peeling and lifting off of a metal pad formed thereon during a pull-up test in a wire bonding process, and a method of manufacturing the same.

One embodiment exemplarily described herein can be characterized as a semiconductor device that includes a metal wiring formed on a lower structure; an insulation layer formed on the lower structure; metal contacts penetrating the insulation layer and connected to the metal wiring; a bridge provided in the insulation layer, the bridge connecting the metal contacts to one another; and a metal pad provided on the insulation layer, the metal pad contacting the metal contacts.

Another embodiment exemplarily described herein can be characterized as a semiconductor device that includes an insulation layer formed on a lower structure; metal contacts extending through the insulation layer; a bridge provided in the insulation layer, wherein the bridge electrically connects a first one of the metal contacts to a second one of the metal contacts; and a metal pad formed on the insulation layer and contacting the first and second ones of the metal contacts, wherein a lower surface of the metal pad contacts a material at a location laterally between the first and second ones of the metal contacts and wherein an adhesive strength between the metal pad and the material is greater than an adhesive strength between the metal pad and the insulation layer.

BRIEF DESCRIPTION OF THE DRAWINGS

Example embodiments will become clearly understood from the following detailed description taken in conjunction with the accompanying drawings, which represent non-limiting, example embodiments as described herein.

DETAILED DESCRIPTION

Figure 1:
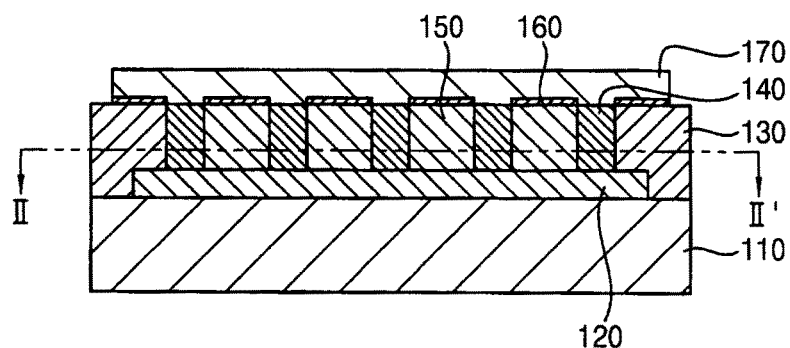
FIG. 1 is a cross-sectional view illustrating a semiconductor device in accordance with an example embodiment of the present invention.

Example embodiments of the present invention are described more fully hereinafter with reference to the accompanying drawings, in which example embodiments of the present invention are shown. These embodiments may, however, be realized in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the present invention will be explained in detail with reference to the accompanying drawings.

Figure 2:
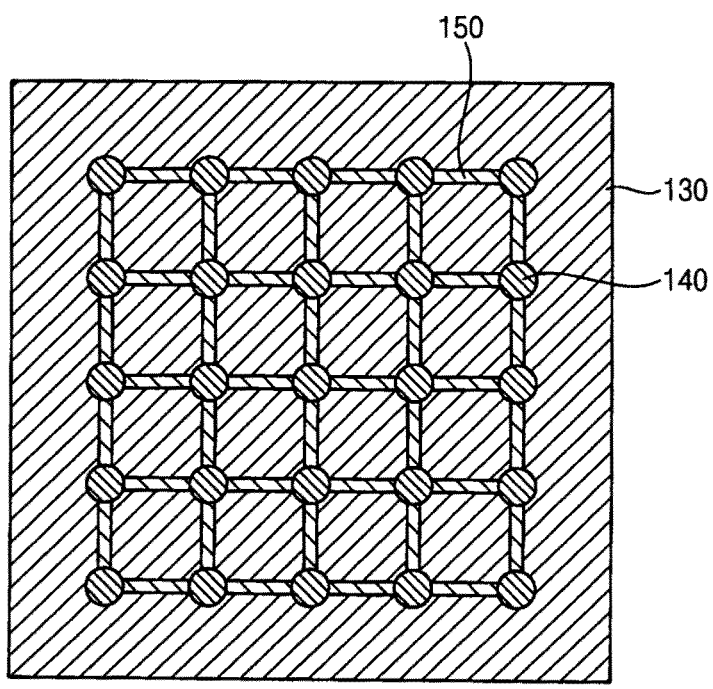
FIG. 2 is a cross-sectional view taken along a line II-II' in FIG. 1.

FIG. 1 is a cross-sectional view illustrating a semiconductor device in accordance with an example embodiment of the present invention. FIG. 2 is a cross-sectional view taken along a line II-II' in FIG. 1.

Referring to FIGS. 1 and 2, a semiconductor device 100 includes a lower structure 110, a metal wiring 120, an insulating layer 130, metal contacts 140, a bridge 150, an adhesive layer 160 and a metal pad 170.

The lower structure 110 includes a plurality of memory devices formed in a semiconductor substrate. Examples of the memory devices may include volatile semiconductor memory devices and non-volatile semiconductor memory devices. Examples of the volatile semiconductor memory devices may include dynamic random access memory (DRAM), static random access memory (SRAM), or the like. Examples of the non-volatile semiconductor memory devices may include an electrically erasable programmable read-only memory (EPROM), an electrically erasable programmable read-only memory (EEPROM), a flash EEPROM, or the like.

The metal wiring 120 is provided on the lower structure 110. The metal wiring 120 connects the memory devices to one another. The metal wiring 120 may include a material such as copper (Cu), aluminum (Al), silver (Ag), gold (Au), or the like or a combination thereof.

The insulation layer 130 is provided on the lower substrate 110 and the metal wiring 120. The insulation layer 130 includes a material such as an oxide. Examples of the oxide may include a material such as silicon oxide, borophosphosilicate glass (BPSG), phosphosilicate glass (PSG), high-density plasma oxide (HDP oxide), tetraethyl orthosilicate (TEOS), or the like or a combination thereof.

The metal contacts 140 penetrate the insulation layer 130 and are connected to the metal wiring 120. The metal contacts 140 may be provided in various shapes. For example, each of the metal contacts 140 may have a cylindrical pillar shape, a polygonal pillar shape, an elliptical pillar shape, or the like. The metal contacts 140 may have shapes that are the same as, or different from, one another.

Distances between the metal contacts 140 may or may not be uniform. The distance between the adjacent metal contacts 140 may be about 0.05 μm or more. When the distance between the adjacent metal contacts 140 is less than about 0.05 μm, the corresponding distance between mask patterns for forming the metal contacts 140 is less than about 0.05 μm. In a manufacturing process of the mask, the mask having the distance between mask patterns of less than about 0.05 μm may be defective. Accordingly, the mask having the distance between mask patterns of more than about 0.05 μm may be more easily manufactured.

The metal contacts 140 may include a metal such as tungsten (W), copper (Cu), aluminum (Al), silver (Ag), gold (Au), or the like or a combination thereof.

The bridge 150 is provided on the insulation layer 130. The bridge 150 connects the metal contacts 140 to one another. One metal pad 170 contacts a plurality of the metal contacts 140. The bridge 150 connects the metal contacts 140 that contact the one metal pad 170 to one another. In an example embodiment, a plurality of the semiconductor devices may be spaced apart from one another on a semiconductor substrate. A respective one of the metal pads of the semiconductor devices is connected to a plurality of the metal contacts by the bridge 150. Accordingly, the bridge 150 may not be connected to metal contacts that contact the metal pad of another semiconductor device (not illustrated).

The bridge 150 may include a metal. The metal of the bridge 150 may be substantially the same as the metal of the metal contacts 140. Examples of the metal of the bridge 150 may include tungsten (W), copper (Cu), aluminum (Al), silver (Ag), gold (Au), or the like or a combination thereof.

The width of the bridge 150 may be different from the width of the metal contacts 140. In an example embodiment, as illustrated in FIG. 2, the width of the bridge 150 may be smaller than the width of the metal contacts 140. In another example embodiment, the width of the bridge 150 may be greater than the width of the metal contacts 140. Accordingly, a region where the bridge 150 is connected to the metal contacts 140 may have a curved profile.

The thickness of the bridge 150 may be substantially the same as the thickness of the metal contacts 140. Accordingly, the bridge 150 may be connected to entire side faces of the metal contacts 140. The bridge 150 may be connected to the metal wiring 120.

Figure 3:
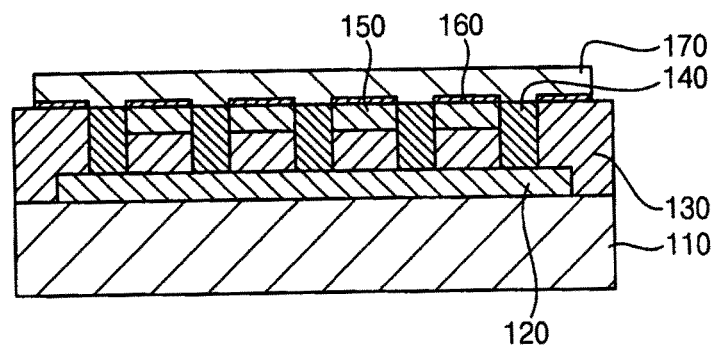
FIG. 3 is a cross-sectional view illustrating a semiconductor in accordance with another example embodiment of the present invention.

FIG. 3 is a cross-sectional view illustrating a semiconductor in accordance with another example embodiment of the present invention.

Referring to FIG. 3, the thickness of the bridge 150 may be smaller than the thickness of the metal contacts 140. The bridge 150 may be connected to a portion of the side faces of the metal contacts 140. In an example embodiment, the bridge 150 may be connected to an upper portion of the side faces of the metal contacts 140. In another example embodiment, the bridge 150 may be connected to a middle portion of the side faces of the metal contacts 140. In still another example embodiment, the bridge 150 may be connected to a lower portion of the side faces of the metal contacts 140.

As mentioned above, the metal contacts 140 and the bridge 150 having different thicknesses and widths from each other may form an uneven structure. Accordingly, a surface area between the metal contacts 140 and the bridge 150 connected to one another may be increased, and a contact area between the insulation layer 130 and the bridge 150 may also be increased.

Referring again to FIGS. 1 and 2, the adhesive layer 160 is provided on the insulation layer 130. The adhesive layer 160 may be provided on the insulation layer 130 except for a region where the metal contacts 140 and the bridge 150 are formed. The adhesive layer 160 may include a material such as titanium (Ti), titanium nitride ($TiN_x$), tantalum (Ta), tantalum nitride ($TaN_x$), or the like or a combination thereof.

The metal pad 170 may be provided on the adhesive layer 160 to contact the metal contacts 140 and the bridge 150. The metal pad 170 may include a metal such as copper (Cu), aluminum (Al), silver (Ag), gold (Au), or the like or a combination thereof.

Alternatively, the adhesive layer 160 may be omitted and the metal pad 170 may be provided on the insulation layer 130 to contact the metal contacts 140 and the bridge 150.

The metal pad 170 may contact not only the metal contacts, but also the bridge 150 to thereby increase the adhesive strength of the metal pad 170. Further, because the region where the metal contacts 140 are connected to the bridge 150 may have a curved profile, a contact area between the metal pad 170 and the insulation layer 130 may be increased. Therefore, peeling or lifting-off of the metal pad 170 and the metal contacts 140 by a pull-up force of the pull-up test in the wire bonding process may be prevented.

FIGS. 4A to 4F are cross-sectional views illustrating a method of manufacturing a semiconductor device in accordance with an example embodiment of the present invention.

Figure 4A:
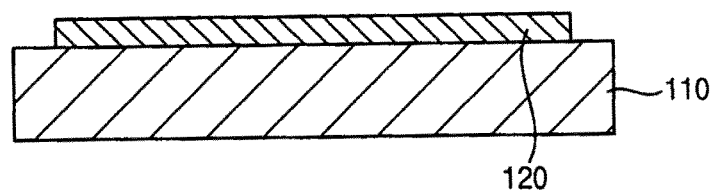
FIGS. 4A to 4F are cross-sectional views illustrating a method of manufacturing a semiconductor device in accordance with an example embodiment of the present invention.

Referring to FIG. 4A, a lower structure 110 including a plurality of memory devices is formed on a semiconductor substrate. After a metal layer is formed on the lower structure 110, the metal layer is selectively etched to form a metal wiring 120. The metal wiring 120 may include a metal such as copper (Cu), aluminum (Al), silver (Ag), gold (Au), or the like or a combination thereof.

Figure 4B:
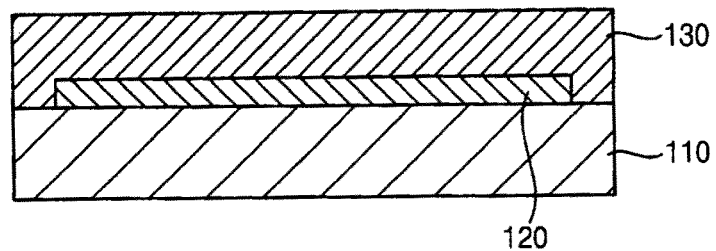

Referring to FIG. 4B, an insulation material is deposited on the lower structure 110 as an insulation layer 130 covering the metal wiring 120.

Figure 4C:
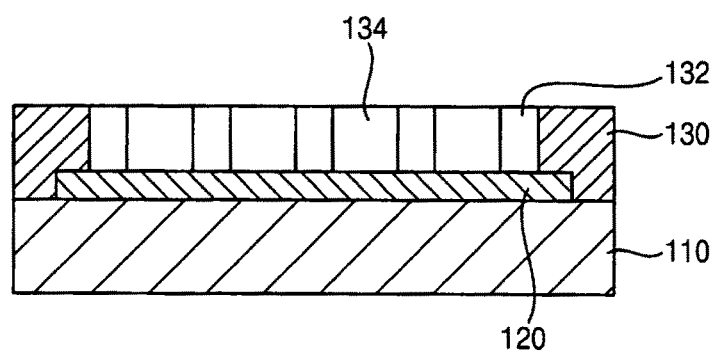

Referring to FIG. 4C, after a mask pattern is formed on the insulation layer 130, the insulation layer 130 is selectively etched using the mask pattern as an etching mask to form contact holes 132 and a bridge hole 134.

In an example embodiment, the contact holes 132 and the bridge hole 134 may be formed simultaneously. For example, the insulation layer 130 may be selectively etched to form the contact holes 132 exposing the metal wiring 120 and to form the bridge hole 134 connecting the contact holes 132 and exposing the metal wiring 120. Therefore, as illustrated in FIG. 4C, the depth of the bridge hole 134 may be substantially the same as depths of the contact holes 132. Accordingly, the bridge hole 134 may be connected to the contact holes 132 from the top surface of the insulation layer 130 to the bottom surface of the insulation layer 130.

In another example embodiment, the contact holes 132 and the bridge hole 134 may be sequentially formed. For example, after the insulation layer 130 is selectively etched to form the contact holes 132 exposing the metal wiring 120, the insulation layer 130 may be selectively etched to form the bridge hole 134 that connects the contact holes and does not expose the metal wiring 120. Therefore, the depth of the bridge hole 134 may be smaller than depths of the contact holes 134. Accordingly, the bridge hole 134 may be connected to upper portions of the contact holes 132 from the top surface of the insulation layer 130 to a level above the bottom surface of the insulation layer 130.

The contact holes 132 may be provided in various shapes. For example, the contact holes 132 may have each have a cylindrical pillar shape, a polygonal pillar shape, an elliptical pillar shape, or the like. The contact holes 132 may have shapes that are the same as, or different from, one another.

Distances between the contact holes 132 may or may not be uniform. When the distance between the adjacent contact holes 132 is less than about 0.05 μm, corresponding distance between mask patterns for forming the contact holes 132 is less than about 0.05 μm. In a manufacturing process of the mask, the mask having the distance between mask patterns of less than about 0.05 μm may be defective. Accordingly, the distance between the adjacent contact holes 132 may be about 0.05 μm or more.

The width of the bridge hole 134 may be different from the width of the contact hole 132. In an example embodiment, the width of the bridge hole 134 may be smaller than the width of the contact hole 132. In another example embodiment, the width of the bridge hole 134 may be greater than the width of the contact hole 132. Accordingly, a portion where the bridge 150 is connected to the metal contacts 140 may have a curved profile.

Figure 4D:
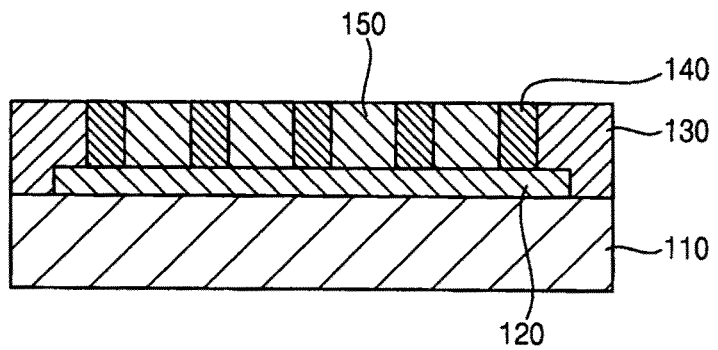

Referring to FIG. 4D, a metal material is deposited on the insulation layer 130 to form a metal layer filling up the contact holes 132 and the bridge hole 134. Examples of the metal material may include tungsten (W), copper (Cu), aluminum (Al), silver (Ag), gold (Au), or the like or a combination thereof. An upper portion of the metal layer is planarized to form metal contacts 140 and a bridge 150. The metal layer may be planarized by a chemical mechanical polishing process (CMP), a grinding process, an etch-back process, or the like or a combination thereof.

Accordingly, when the contact holes 132 and the bridge hole 134 are formed simultaneously, the bridge 150 may be connected to the entire side faces of the metal contacts 140. When the contact holes 132 and the bridge hole 134 are sequentially formed, the bridge 150 may be connected to the upper portions of the side faces of the metal contacts 140.

In another example embodiment, an additional insulation layer (not shown) may be formed on the insulation layer 130 after forming the bridge 150 that is connected to the entire side faces of the metal contacts 140. Subsequently, other contact holes (not shown) may be formed to penetrate the additional insulation layer and expose the metal contacts 140. The other contact holes may then be filled with, for example, additional metal material to form modified metal contacts. Thus, a height of the modified metal contacts may be greater than the height of the metal contacts 140. Consequently, the bridge 150 is connected to the lower portions of the side faces of the modified metal contacts.

In still another example embodiment, an additional insulation layer (not shown) may be formed on the insulation layer 130 after forming the bridge 150 that is connected to the upper side faces of the metal contacts 140. Subsequently, other contact holes (not shown) may be formed to penetrate the additional insulation layer and expose the metal contacts 140. Then, the other contact holes are filled with a metal material to form the bridge 150 that is connected to the middle portions of the side faces of the metal contacts 140.

Figure 4E:
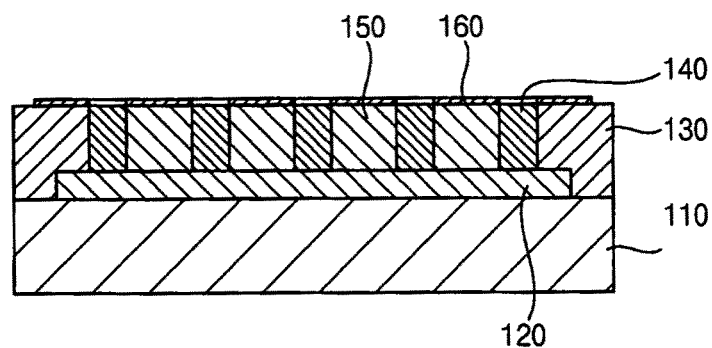

Referring to FIG. 4E, an adhesive material is deposited on the insulation layer 130 including the metal contacts 140 and the bridge 150 to form an adhesive layer 160. The adhesive layer 160 is selectively etched to expose the metal contacts 140 and the bridge 150. The adhesive layer 160 may include a material such as titanium (Ti), titanium nitride ($TiN_x$), tantalum (Ta), tantalum nitride ($TaN_x$), or the like or a combination thereof.

Figure 4F:
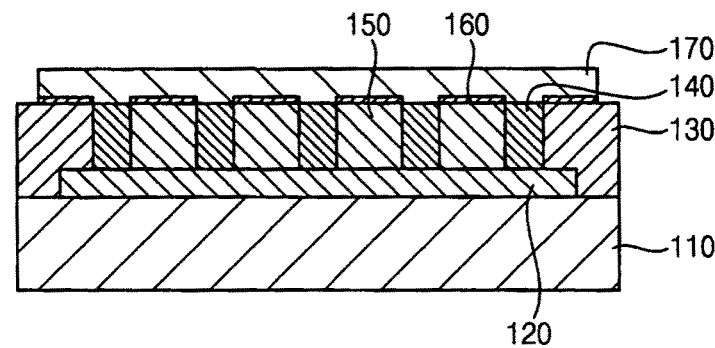

Referring to FIG. 4F, a metal material is deposited on the adhesive layer 160 to form a metal layer, and the metal layer is selectively etched to form a metal pad 170 contacting the metal contacts 140 and the bridge 150. Examples of the metal material may include copper (Cu), aluminum (Al), silver (Ag), gold (Au), or the like or a combination thereof.

In another embodiment, the adhesive layer 160 may be omitted and the metal pad 170 may be formed only on the insulation layer 130 to contact the metal contacts 140 and the bridge 150.

Figure 5:
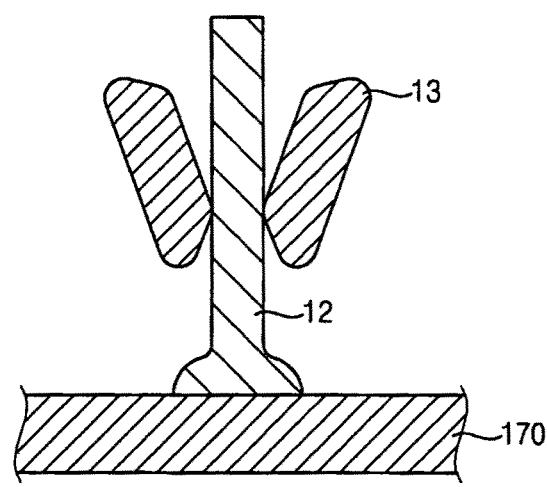
FIG. 5 is a cross-sectional view illustrating a pull-up test in a wire bonding process in accordance with an example embodiment of the present invention.

FIG. 5 is a cross-sectional view illustrating a pull-up test in a wire bonding process in accordance with an example embodiment of the present invention.

Referring to FIG. 5, in a pull-up test in a wire bonding process, a wire 12 may be connected to the metal pad 170. A capillary 13 for testing the strength of the wire 12 contacts the wire 12. In the pull-up test for ensuring the reliability of the wire bonding, the capillary 13 is pulled up to test the strength of the wire 12.

According to some embodiments described above, the metal pad 170 may contact not only the metal contacts 140, but also the bridge 150 to thereby increase the adhesive strength of the metal pad 170. Further, because the region where the metal contacts 140 are connected to the bridge 150 may have a curved profile, a contact area between the metal pad 170 and the insulation layer 130 may be increased. Thus, peeling or lifting-off of the metal contacts 140 by a pull-up force of the pull-up test in the wire bonding process due to a weak adhesive strength between the insulation layer 130 and metal plugs 140 can be either significantly reduced or prevented. Further, the metal pad 170 may contact not only the metal contacts 140, but also the bridge 150 or the adhesive layer 160 to thereby increase the adhesive strength of the metal pad 170 compared to the adhesive strength between the metal pad 170 and the insulation layer 130. Thus, peeling or lifting-off of the metal pad 170 by a pull-up force of the pull-up test in the wire bonding process can be either significantly reduced or prevented.

According to some example embodiments of the present invention, a bridge is provided between metal contacts to connect the metal contacts to each other. A metal pad contacts the metal contacts and the bridge. Because the width of the metal contacts is different from the width of the bridge, a region where the metal contacts are connected to the bridge has a curved profile to thereby increase the adhesive strength of the metal pad.

Since the adhesive strength of the metal pad is increased, peeling or lifting-off of the metal pad by a pull-up force of a pull-up test in a wire bonding process may be prevented.

As described above, embodiments of the present invention may be practiced in many ways. The following is a general, non-limiting, discussion of some exemplary embodiments of the present invention.

According to some example embodiments of the present invention, a semiconductor device includes a lower structure, an insulation layer, metal contacts, a bridge and a metal pad. The lower structure has a metal wiring. An insulation layer is formed on the lower structure. The metal contacts penetrate the insulation layer to be connected to the metal wiring. The bridge is provided in the insulation layer, the bridge connecting the metal contacts to one another. The metal pad is provided on the insulation layer, the metal pad making contact with the metal contacts.

In an example embodiment, the width of the bridge may be different from the width of the metal contacts.

In another example embodiment, the thickness of the bridge may be the same as the thickness of the metal contacts.

In still another example embodiment, the thickness of the bridge may be smaller than the thickness of the metal contacts.

The height of an upper portion of the bridge may be substantially identical to that of an upper portion of each of the metal contacts.

In still another example embodiment, the metal contacts and the bridge may include the same material.

In still another example embodiment, the semiconductor device may further include an adhesive layer between the insulation layer and the metal pad.

The adhesive layer may include a titanium layer, a titanium nitride layer, a tantalum layer, a tantalum nitride layer, etc. These may be used alone or in a combination thereof.

According to some example embodiments of the present invention, there is provided a method of manufacturing a semiconductor device. In the method, a lower structure having a metal wiring is formed. An insulation layer is formed on the lower structure. Contact holes and a bridge hole are formed in the insulation layer, the contact holes exposing the metal wiring and the bridge hole connecting the contact holes to one another. The contact holes and the bridge hole are filled with a metal material to form metal contacts and a bridge. A metal pad is formed on the insulation layer, the metal pad making contact with the metal contacts.

In an example embodiment, the width of the bridge hole may be different from the width of the contact holes.

In another example embodiment, the thickness of the bridge hole may be the same as the thickness of the contact holes.

In still another example embodiment, the thickness of the bridge may be smaller than the thickness of the contact holes.

The height of an upper portion of the bridge may be substantially identical to that of an upper portion of each of the metal contacts.

In still another example embodiment, the metal contacts and the bridge may include the same material.

In still another example embodiment, the method may further include forming an adhesive layer between the insulation layer and the metal pad.

The adhesive layer may include a titanium layer, a titanium nitride layer, a tantalum layer, a tantalum nitride layer, etc. These may be used alone or in a combination thereof.

According to some example embodiments of the present invention, a bridge is provided between metal contacts to connect the metal contacts to each other. The metal pad makes contact with the metal contacts and the bridge. Thus, since the adhesive strength of the metal pad is increased, peeling or lifting-off of the metal pad by a pull-up force of the pull-up test in the wire bonding process may be prevented.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific example embodiments disclosed, and that modifications to the disclosed example embodiments, as well as other example embodiments, are intended to be included within the scope of the appended claims. The present invention is defined by the following claims, with equivalents of the claims to be included therein.

What is claimed is:

1. A bridge type pad structure of a semiconductor device, comprising:

a first metal pad formed on a lower structure;

an insulation layer formed on the lower structure and covering the first metal pad;

metal contacts formed in the insulation layer and connected to the same first metal pad, end portions of the metal contacts contacting the same first metal pad, wherein each of the metal contacts comprises one of a cylindrical pillar shape or an elliptical pillar shape;

a bridge formed in the insulation layer, the bridge connecting the metal contacts to one another; and a second metal pad provided on the insulation layer, the second metal pad being directly in contact with the metal contacts, wherein the bridge is connected to side faces of the metal contacts, and wherein a region of the bridge that is connected to the side faces of the metal contacts comprises a curved profile, and wherein a thickness of the bridge is smaller than a thickness of each of the metal contacts, and a height of an upper surface of the bridge above the first metal pad is substantially equal to a height of an upper surface of each of the metal contacts above the first metal pad.

2. The semiconductor device of claim 1, wherein a width of the bridge is different from a width of each of the metal contacts.

3. The semiconductor device of claim 1, wherein a thickness of the bridge is substantially the same as a thickness of each of the metal contacts.

4. The semiconductor device of claim 1, wherein the metal contacts and the bridge comprise substantially the same material.

5. The semiconductor device of claim 1, further comprising an adhesive layer between the insulation layer and the second metal pad.

6. A semiconductor device, comprising:
a metal wiring formed on a lower structure;
an insulation layer formed on the lower structure;
metal contacts penetrating the insulation layer and directly in contact with the metal wiring;
a bridge provided in the insulation layer, the bridge connecting the metal contacts to one another;
a metal pad provided on the insulation layer, the metal pad being directly in contact with the metal contacts; and
an adhesive layer directly between the insulation layer and the metal pad, the adhesive layer directly contacting the insulation layer and the metal pad and exposing the metal contacts such that the metal pad is directly in contact with the metal contacts, wherein the adhesive layer comprises at least one selected from the group consisting of titanium, titanium nitride, tantalum, and tantalum nitride, and wherein the bridge is directly connected to side surfaces of the metal contacts, and wherein the upper surfaces of the metal contacts and the bridge are substantially the same distance from the metal wiring.

7. A bridge type pad structure of a semiconductor device, comprising:
a first metal pad formed on a lower structure;
an insulation layer formed on the lower structure and covering the first metal pad;
metal contacts extending through the insulation layer and connected to the same first metal pad, end portions of the metal contacts directly contacting the same first metal pad;
a bridge provided in the insulation layer, wherein the bridge electrically connects a first one of the metal contacts to a second one of the metal contacts, wherein the bridge is directly connected to side surfaces of the metal contacts; and
a second metal pad formed on the insulation layer and directly contacting the first and second ones of the metal contacts, wherein a lower surface of the second metal pad contacts an adhesive at a location laterally between the first and second ones of the metal contacts, wherein the adhesive exposes the first and second ones of the metal contacts such that the second metal pad directly contacts the first and second ones of the metal contacts and wherein an adhesive strength between the second metal pad and the adhesive is greater than an adhesive strength between the second metal pad and the insulation layer,
wherein the upper surfaces of the metal contacts and the bridge are substantially the same distance from the first metal pad.

8. The semiconductor device of claim 7, wherein the bridge is connected to lower portions of the first and second ones of the metal contacts.

9. The semiconductor device of claim 7, wherein the bridge is connected to middle portions of the first and second ones of the metal contacts.

10. The semiconductor device of claim 7, wherein the bridge is connected to upper portions of the first and second ones of the metal contacts.

* * * * *